(12) United States Patent
Savic et al.

(10) Patent No.: US 7,444,727 B2
(45) Date of Patent: Nov. 4, 2008

(54) METHOD FOR FORMING MULTI-LAYER EMBEDDED CAPACITORS ON A PRINTED CIRCUIT BOARD

(75) Inventors: Jovica Savic, Downers Grove, IL (US); Remy J. Chelini, Crystal Lake, IL (US); Gregory J. Dunn, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 322 days.

(21) Appl. No.: 11/276,688

(22) Filed: Mar. 10, 2006

(65) Prior Publication Data
US 2007/0209178 A1    Sep. 13, 2007

(51) Int. Cl.
*H01G 7/00* (2006.01)
*H01L 21/20* (2006.01)

(52) U.S. Cl. .................. 29/25.42; 29/846; 29/852; 29/25.03; 361/301.1; 438/381

(58) Field of Classification Search ........... 29/830–836, 29/846–847, 852, 25.35–25.42, 25.01–25.03; 361/321.2, 321.3, 311, 303, 763, 301.1; 428/701, 428/226, 694, 702; 438/109, 112, 381, 636–638; 257/698, 676, 692
See application file for complete search history.

(56) References Cited

U.S. PATENT DOCUMENTS

| | | | | |
|---|---|---|---|---|
| 4,232,059 | A * | 11/1980 | Proffitt | 216/17 |
| 5,370,766 | A * | 12/1994 | Desaigoudar et al. | 216/13 |
| 6,103,134 | A | 8/2000 | Kingon et al. | |
| 6,317,948 | B1 * | 11/2001 | Kola et al. | 29/25.42 |
| 6,349,456 | B1 | 2/2002 | Dunn et al. | |
| 6,524,352 | B2 * | 2/2003 | Adae-Amoakoh et al. | 29/25.03 |
| 6,541,137 | B1 | 4/2003 | Dunn et al. | |
| 6,963,483 | B2 * | 11/2005 | Chakravorty et al. | 361/306.3 |
| 6,967,138 | B2 * | 11/2005 | Ding | 438/253 |
| 7,012,022 | B2 * | 3/2006 | Liu et al. | 438/636 |
| 7,056,800 | B2 * | 6/2006 | Croswell et al. | 438/381 |
| 7,100,277 | B2 * | 9/2006 | Borland et al. | 29/832 |
| 7,193,838 | B2 * | 3/2007 | Dunn et al. | 361/301.1 |
| 2002/0011351 | A1 | 1/2002 | Ogawa et al. | |
| 2006/0002097 | A1 | 1/2006 | Borland et al. | |
| 2007/0209178 | A1 * | 9/2007 | Savic et al. | 29/25.41 |

* cited by examiner

*Primary Examiner*—Minh Trinh

(57) ABSTRACT

A method for forming embedded capacitors on a printed circuit board is disclosed. The capacitor is formed on the printed circuit board by a depositing a first dielectric layer over one or more electrodes situated on the PCB. Another electrode is formed on top of the first dielectric layer and a second dielectric layer is deposited on top of that electrode. A third electrode is formed on top of the second dielectric layer. The two dielectric layers are abrasively delineated in a single step by a method such as sand blasting to define portions of the first and second dielectric layers to create a multilayer capacitive structure.

9 Claims, 2 Drawing Sheets

METHOD FOR FORMING MULTI-LAYER EMBEDDED CAPACITORS ON A PRINTED CIRCUIT BOARD

FIELD OF THE INVENTION

This invention relates generally to electrical circuits and their fabrication. More particularly, this invention relates to a process for forming a microelectronic assembly with photo-defined integral multilayer capacitors that have a wide range of capacitance values, and a printed circuit board having the multilayer capacitors thereon.

BACKGROUND

Integral capacitors for hybrid microelectronics circuits have been known and widely used for some time. These capacitors are typically formed by a patterning a conductive region on a ceramic substrate to define a bottom electrode, depositing a thin layer of a dielectric material over the bottom electrode to form the dielectric for the capacitor, and then forming a second electrode over the dielectric, patterned to form the capacitor. Recently, the concept of forming integral capacitors has been transferred from ceramic substrates to printed circuit boards (PCB). Dielectric materials typically consist of polymers, polymers filled with ceramic materials, or pure ceramic thin films. The addition of ceramic particles to the polymer matrix increases the dielectric constant of the mixture. One type of capacitor dielectric employs a polymer filled with ceramic powder, and another type of capacitor dielectric is a high permittivity perovskite ceramic material. The ceramic filled polymers can generally be photo-defined, and provide low capacitance density (17 picofarads/mm$^2$). They are used to form capacitors having values less than about 150 picofarads (pF). The perovskite ceramic material, however, is not photo-definable, and must be patterned using strong acids such as hydrofluoric acid or by plasma etching, and has a much higher capacitance density (3000 pF/mm$^2$). It is generally used to form capacitors having values greater than 150 pF. Thus, these two technologies complement each other by providing a wide range of capacitor values, but the widely varying processing parameters are not compatible, and therefore prevent a combined use of the two technologies that is cost effective and allows both types of capacitor easily to be placed on the same board layer.

It would be desirable if a method could be devised wherein the ceramic filled polymer could be combined with the perovskite ceramic on the same printed circuit board layer in order to achieve a wider range of capacitance values in a compact volume and board area, and with a minimal number of process steps.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

A method for forming embedded capacitors on a printed circuit board is disclosed. The capacitor is formed on the printed circuit board by a depositing a first dielectric layer over one or more electrodes situated on the PCB. Another electrode is formed on top of the first dielectric layer and a second dielectric layer is deposited on top of that electrode. A third electrode is formed on top of the second dielectric layer. The two dielectric layers are abrasively delineated in a single step, for example by sand blasting, to define portions of the first and second dielectric layers so as to create a multilayer capacitive structure.

Figure 3:
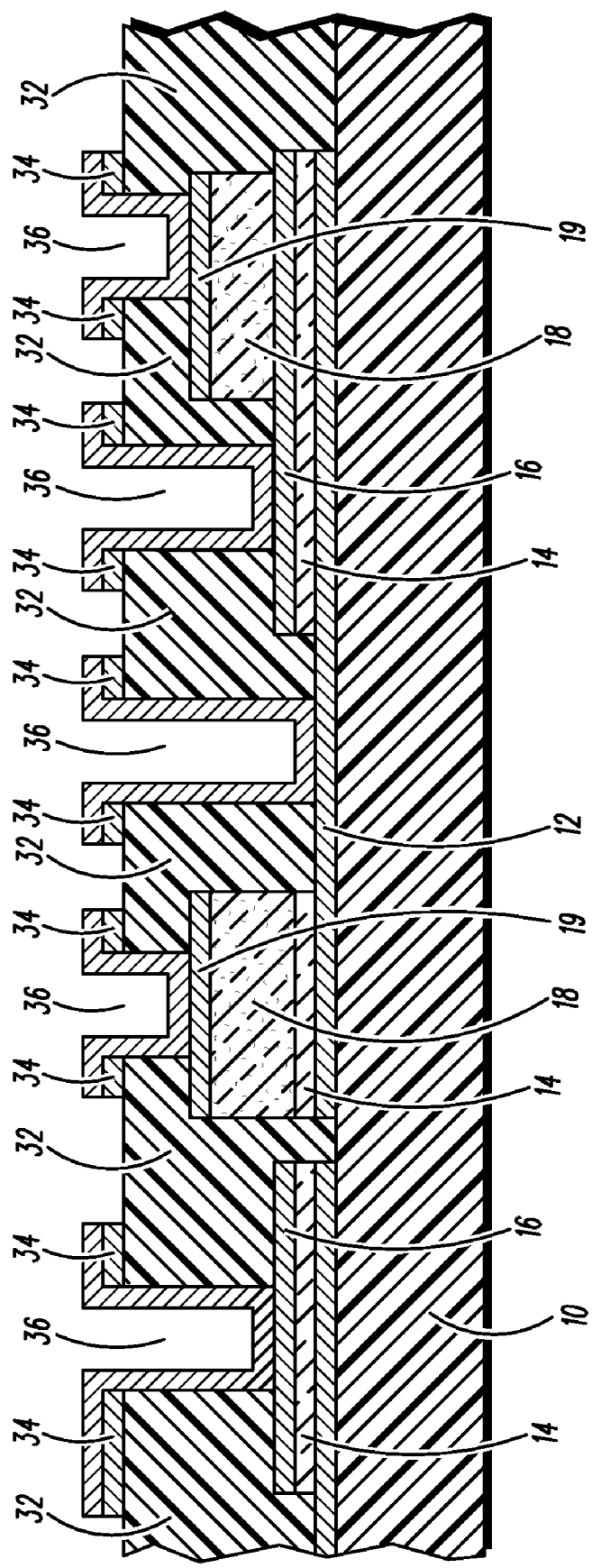
FIG. 3 is a partial cross sectional view of embedded capacitors on a printed circuit board in accordance with certain embodiments of the present invention.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. While a particular configuration for the capacitors is shown in FIG. 3, those skilled in the art will appreciate that variations and modifications are possible, and such variations and modifications are within the scope of this invention.

Figure 1:
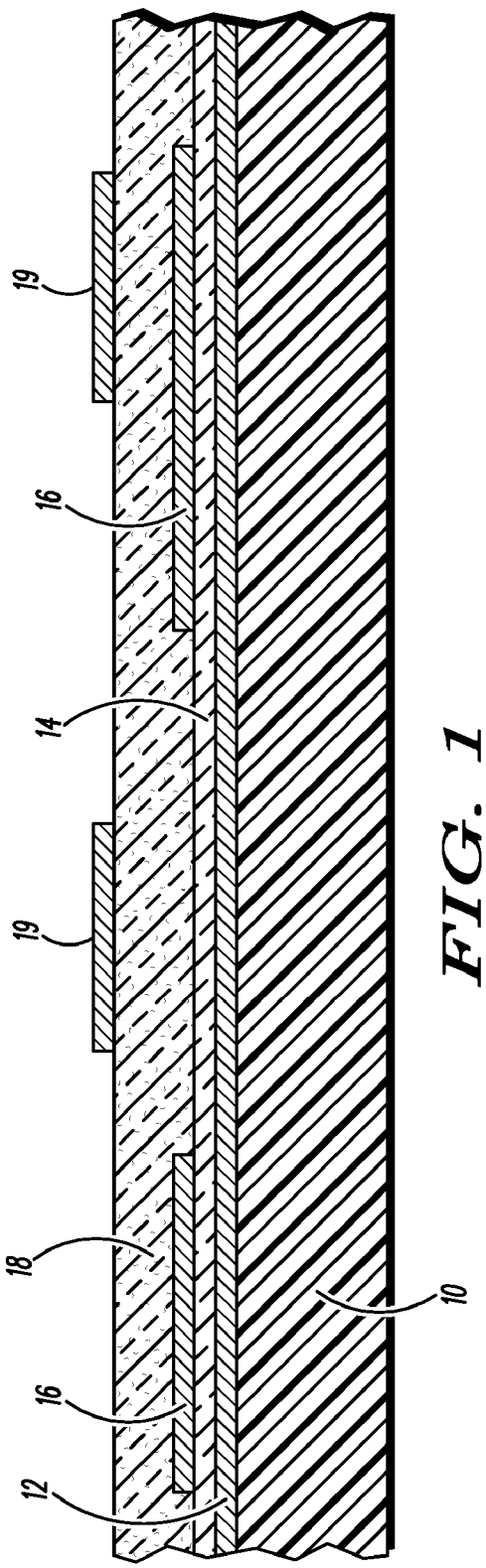
FIGS. 1 and 2 illustrate partial cross sectional views by which embedded capacitors are formed on a printed circuit board in accordance with certain embodiments of the present invention.

Referring now to FIG. 1, the circuit board is shown as having a substrate 10 on which a conductor layer 12 and a first dielectric layer 14 have been formed. The substrate 10 is preferably a printed circuit board (PCB) such as glass-epoxy, glass-polyimide, or a flexible circuit, but it can be any suitable material, including another dielectric layer of a multilayer circuit. Because the conductor layer 12 may be patterned to form bottom electrodes for the capacitors shown in FIG. 3, the conductor layer 12 is preferably planar copper deposited on the substrate 10 by plating or by lamination of a copper foil, though it is foreseeable that the conductor layer 12 could be formed by different methods and with different materials. A suitable thickness for the conductor layer 12 is about five to about fifty micrometers. The conductive metal layer comprises a metal selected from the group consisting of copper, copper alloy, nickel and nickel alloy. The conductor layer 12 is shown as an unpatterned sheet, but it may be patterned, at any of several points in the fabrication process, by conventional photolithographic means to form distinct electrodes. For example, conductor layer 12 may be patterned while it is part of a capacitive sheet sub-assembly, before the sub-assembly is laminated to the substrate 10, or it may be patterned later in the fabrication process, after overlying layers have been patterned to expose parts of the conductor layer 12.

The first dielectric layer 14 is a high permittivity perovskite ceramic material. Specific examples of perovskite ceramics according to this invention include lead zirconium titanate (PZT), lead lanthanide zirconium titanate (PLZT), lead calcium zirconium titanate (PCZT), lead lanthanide titanate (PLT), lead titanate (PT), lead zirconate (PZ), lead magnesium niobate (PMN), barium titanate (BTO) and barium strontium titanate (BSTO). Lead based dielectric oxides comprising the PZT system, particularly compositions comprising the PCZT formula $PbCa_x(Zr_{0.52}Ti_{0.48})O_3$, where x is from 0.01 to 0.1, are particularly attractive. The addition of small quantities of elements such as Ni, Nb, Ca and Sr in compounds that do not specifically name them can also improve electrical performance. Accordingly, the dielectric oxides of some embodiments of the present invention may also contain small quantities of Ni, Nb, Ca and Sr. These materials have a dielectric constant of 1000 to 5000 and a capacitance density of about 3000 $pF/mm^2$, and are typically used to form capacitors having values greater than 150 pF, up to 30,000 pF. They are typically applied over the entire surface of the copper foil conductor layer 12 in a thickness ranging from 0.05 to 25 micrometers, with 0.5 micrometers being common. One could also deposit the ceramic only over portions of the conductor layer 12, if desired. Thereafter, another conductor layer 16 is disposed on the exposed surface of the first dielectric layer 14 to create one or more second electrodes 16. In one embodiment, the conductor layer 12, the first dielectric layer 14, and the second conductor layer 16 are formed together into a capacitive sheet sub-assembly, and then laminated together onto the substrate 10. This approach allows high temperature (greater than 300 C) crystallization of the perovskite dielectric layer 14 without exposing the substrate 10 to such temperatures, which would ignite or otherwise damage the substrate 10. The second conductor layer 16 is patterned in conventional manner so as to form the electrodes, such as etching, or pattern plating, or other techniques well known to those skilled in the art. These second electrodes 16 will subsequently act as a "resist" for the underlying first dielectric layer 14 in an abrasive delineation step to follow later. They also form the top electrode of a 'capacitor sandwich' comprising the first electrode 12, the first dielectric 14 and the second electrode 16.

A second dielectric layer 18 is then deposited over the second electrodes and any exposed portions of the first dielectric layer 14. The second dielectric layer 18 is preferably formed of a polymer that is filled with particles of ceramic materials such as lead magnesium niobate, lead titanate and/ or barium titanate. A suitable particle size for the ceramic is about 0.2 to 5 micrometers. The ceramic-filled polymer can be any suitable liquid resin or solid resin, so as to enable the resin mixture to be readily deposited over the exposed surfaces of the second electrodes 16 and the first dielectric 14 in liquid form or as a laminate to form the second dielectric layer 18. Resins that could be used include thermoplastic resins, thermosetting resins, elastomers and mixtures thereof. The ceramic filled polymers generally provide low capacitance density (17 $picofarads/mm^2$), and are used to form capacitors having values less than 150 picofarads (pF).

Still another conductor layer 19 is disposed on the exposed surfaces of the second dielectric layer 18 to create one or more third electrodes 19. This conductor layer 19 can be patterned in conventional manner, as previously described, so as to form the electrodes. These third electrodes 19 will also subsequently act as a "resist" for the underlying second dielectric layer 18 in the abrasive delineation step to follow later. The third electrodes 19 ultimately form the top electrode of another 'capacitor sandwich' comprising the second electrode 16, the second dielectric 18 and the third electrode 19.

Figure 2:
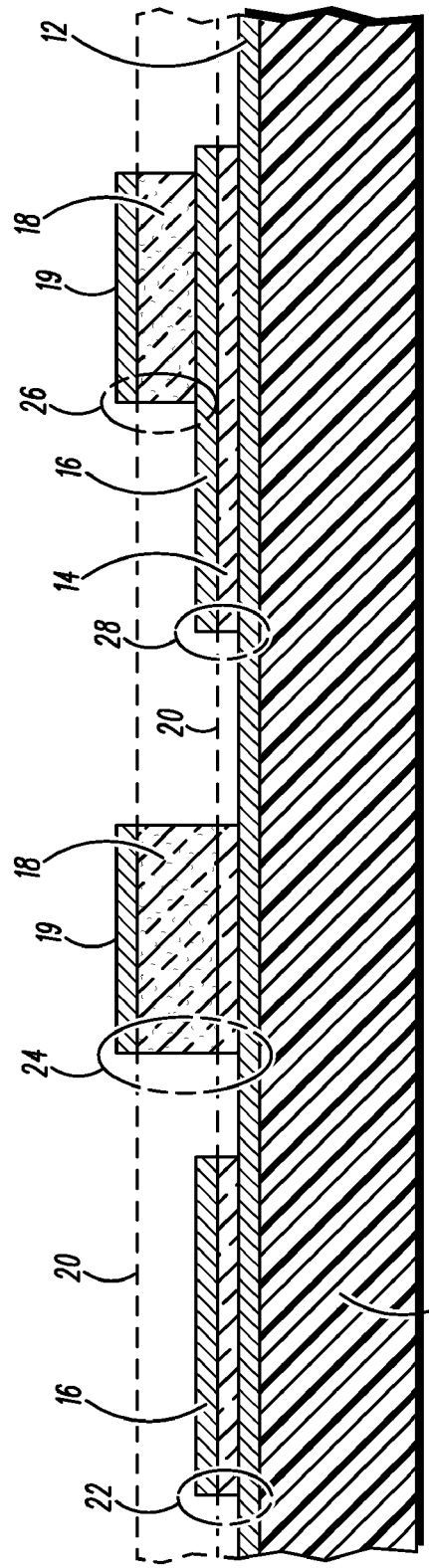

Turning now to FIG. 2, the capacitors are formed by removing unwanted portions of the first and second dielectrics 14, 18 in a single step. This is accomplished by using techniques such as sand blasting, jet scrubbing or wet blasting (jet scrubbing enhanced with compressed air) that abrasively engrave away any exposed portions 20 of the dielectrics, that is, those portions that are not covered with metal. Since the metal electrodes 16, 19 are more ductile than the brittle dielectrics 14, 18, they act as a 'resist' to the abrasive process, such that they delineate the capacitors. The brittle ceramic-filled polymer material in the second dielectric layer 18 easily abrades away to expose portions of the first dielectric layer 14 which also yields to the abrasive power of the sand blasting, jet scrubbing or wet blasting process. In one embodiment, these abraded portions of the first dielectric layer 14 are fractured but not entirely removed by the abrasive process. This fracturing is sufficient, however, because complete removal of the abraded portions of the first dielectric layer 14 is not required. When the underlying conductor layer 12 is exposed through the openings provided by the fractured ceramic, it can be patterned by conventional chemical etching techniques. Fracturing the first dielectric layer 14 allows a liquid chemical etchant to pass therethrough and attack the exposed metallic conductor layer 12. Typically, the residual fragments of the first dielectric layer 14 are lifted away as the conductor layer 12 is dissolved by the etchant.

What remains after the abrasive delineation step has removed all the material represented within the boundaries of the phantom lines 20 are a series of capacitors 22, 24, 26, 28 having a dielectric material sandwiched between two electrodes. This method eliminates the need for aqueous or solvent developers used in prior art systems to develop photo-definable dielectrics, and also eliminates the need for harsh chemicals such as inorganic acids used to dissolve ceramic materials, and allows one to delineate both the low value dielectric materials and the high value dielectric materials in just one step.

In order to farther elucidate the invention, we will now illustrate a typical implementation. Assuming, for example, that the smallest and largest practical areas for embedded capacitors on a PCB are 0.05 $mm^2$ and 10 $mm^2$, respectively, we can see in TABLE 1 that ceramic filled polymer dielectrics could produce capacitors in the range of 0.85 pF to 150 pF, and that perovskite ceramic dielectrics could produce capacitors in the range of 150 pF to 30,000 pF. Therefore, capacitors 22 and 28 could have values between 150 pF and 30,000 pF, capacitors 24 and 26 could have values between 0.85 pF and 150 pF (the law of capacitance in series determines that capacitor 24, which comprises both high and low capacitance dielectrics in series, will have a value similar to capacitor 26, which comprises only the low capacitance dielectric).

TABLE 1

Capacitance of Two Capacitor Materials as a Function of Capacitor Area

|  | 0.05 $mm^2$ Capacitor area | 10 $mm^2$ Capacitor area |
| --- | --- | --- |
| Ceramic-filled polymer (17 $pF/mm^2$) | 0.85 pF | 150 pF |
| Perovskite ceramic (3000 $pF/mm^2$) | 150 pF | 30,000 pF |

Referring now to FIG. 3, in another embodiment of our invention, a third dielectric layer 32 can be deposited over all exposed surfaces of the first, second, and third electrodes 12, 16, 19 and the first and second dielectrics 14, 18. This third dielectric layer 32 forms an electrical and environmental insulation barrier over the capacitors. An additional metallization layer 34 can then be applied on the third dielectric layer 32 to route circuit traces in conventional manner. These traces 34 can then be optionally electrically connected to the various capacitors 22, 24, 26, 28 by means of vias 36 through the third dielectric 32. The vias 36 can extend either partially or completely through the third dielectric 32 to connect the circuit traces 34 to the first metal layer 12, if necessary.

In summary, without intending to limit the scope of the invention, embedded capacitors having a wide range of values can be formed on a printed circuit board according to a method consistent with certain embodiments of the invention that can be carried out by abrasively removing two different types of dielectric media in a single step. While the invention has been described in conjunction with specific embodiments, it is evident that many alternatives, modifications, permutations and variations will become apparent to those of ordinary skill in the art in light of the foregoing description. For example, the second dielectric layer could also be a perovskite ceramic. Or, prior to the sandblasting step, a layer of another material could be applied over the third electrode to act as a mask in the abrasive process instead of using the third electrode as the 'resist'. Accordingly, it is intended that the present invention embrace all such alternatives, modifications and variations as fall within the scope of the appended claims.

What is claimed is:

1. A method for forming embedded capacitors on a printed circuit board, the method comprising:

providing a printed circuit board having one or more first electrodes situated on a major surface thereof, a first dielectric layer overlying at least one or more of the first electrodes, one or more second electrodes overlying the first dielectric layer, a second dielectric layer overlying at least one or more of the second electrodes, and one or more third electrodes overlying the second dielectric layer; and abrasively delineating the second dielectric layer and first dielectric layer in one step to define those portions of the first and second dielectric layers that will remain to form multilayer capacitive structures;

whereby a first capacitor is formed by a combination of at least one of the first electrodes, the first dielectric layer, and at least one of the second electrodes, and whereby a second capacitor is formed by a combination of at least one of the second electrodes, the second dielectric layer, and at least one of the third electrodes.

2. The method as described in claim 1, wherein the first dielectric layer comprises perovskite ceramic.

3. The method as described in claim 2, wherein the second dielectric layer comprises perovskite ceramic.

4. The method as described in claim 1, wherein the second dielectric layer comprises a ceramic filled polymer.

5. The method as described in claim 1, wherein abrasively delineating comprises sand blasting, jet scrubbing, or wet blasting.

6. The method as described in claim 1, further comprising, after abrasively delineating, removing those portions of the one or more first electrodes that underlie the portions of the first dielectric layer that were abrasively delineated.

7. The method as described in claim 1, wherein abrasively delineating further comprises using the third and second electrodes as patterns in order to define those portions of the second and first dielectric layers, respectively, that will remain to form multilayer capacitive structures.

8. The method as described in claim 1, further comprising, after abrasively delineating, forming a third dielectric layer overlying all exposed surfaces of the first and second dielectric layers and the first, second, and third electrodes.

9. The method as described in claim 8, further comprising forming electrically conductive vias in the third dielectric layer to make electrical connection to the first electrodes, the second electrodes, or the third electrodes.

* * * * *